US011195753B2

(12) United States Patent
Choi et al.

(10) Patent No.: US 11,195,753 B2
(45) Date of Patent: Dec. 7, 2021

(54) TIERED-PROFILE CONTACT FOR SEMICONDUCTOR

(71) Applicant: International Business Machines Corporation, Armonk, NY (US)

(72) Inventors: Kisik Choi, Watervliet, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 237 days.

(21) Appl. No.: 16/134,649

(22) Filed: Sep. 18, 2018

(65) Prior Publication Data

US 2020/0090995 A1 Mar. 19, 2020

(51) Int. Cl.
*H01L 21/768* (2006.01)
*H01L 23/535* (2006.01)
(Continued)

(52) U.S. Cl.
CPC .. *H01L 21/76897* (2013.01); *H01L 21/28088* (2013.01); *H01L 21/76805* (2013.01); *H01L 21/76816* (2013.01); *H01L 21/76895* (2013.01); *H01L 21/823807* (2013.01); *H01L 21/823814* (2013.01); *H01L 21/823821* (2013.01); *H01L 21/823842* (2013.01); *H01L 21/823871* (2013.01); *H01L 21/823878* (2013.01); *H01L 23/5283* (2013.01); *H01L 23/535* (2013.01); *H01L 27/0924* (2013.01);
(Continued)

(58) Field of Classification Search
CPC ......... H01L 21/28088; H01L 21/76805; H01L 21/76895; H01L 21/76897; H01L 21/823871; H01L 21/76816; H01L 23/528; H01L 23/5283; H01L 23/535; H01L 29/1054; H01L 29/66545; H01L 29/66606; H01L 29/6681; H01L 29/66871
See application file for complete search history.

(56) References Cited

U.S. PATENT DOCUMENTS 5,753,561 A * 5/1998 Lee ................... H01L 21/76232
257/E21.549
5,795,804 A * 8/1998 Jenq ................... H01L 27/10817
257/E21.648
(Continued)

*Primary Examiner* — Maliheh Malek
(74) *Attorney, Agent, or Firm* — Erik Johnson; Michael J. Chang, LLC

(57) ABSTRACT

Tiered-profile contacts for semiconductor devices and techniques for formation thereof are provided In one aspect, a method for forming tiered-profile contacts to a semiconductor device includes: depositing a first oxide layer over the semiconductor device; depositing a second oxide layer on the first oxide layer; patterning contact trenches through the first/second oxide layer down to the semiconductor device; isotropically etching a top portion of the contact trenches selective to a bottom portion of the contact trenches based on the second oxide layer having a greater etch rate than the first oxide layer to make the top portion of the contact trenches wider than the bottom portion; and filling the contact trenches with a contact metal(s) to form the tiered-profile contacts. Other methods to form tiered-profile contacts using sacrificial spacers as well as structures including the present tiered-profile contacts are also provided.

15 Claims, 15 Drawing Sheets

B-B'

(51) Int. Cl.
    *H01L 23/528*     (2006.01)
    *H01L 21/28*     (2006.01)
    *H01L 21/8238*     (2006.01)
    *H01L 29/10*     (2006.01)
    *H01L 29/08*     (2006.01)
    *H01L 29/49*     (2006.01)
    *H01L 29/66*     (2006.01)
    *H01L 27/092*     (2006.01)

(52) U.S. Cl.
    CPC ...... *H01L 29/0847* (2013.01); *H01L 29/1054* (2013.01); *H01L 29/4966* (2013.01); *H01L 29/66545* (2013.01)

(56) References Cited

U.S. PATENT DOCUMENTS

| | | | |
|---|---|---|---|
| 6,214,697 B1 * | 4/2001 | Moore | H01L 21/76224 257/E21.546 |
| 6,316,808 B1 | 11/2001 | Smith, III | |
| 6,596,598 B1 | 7/2003 | Krivokapic et al. | |
| 7,037,994 B2 | 5/2006 | Sugita et al. | |
| 7,244,549 B2 | 7/2007 | Iwasawa et al. | |
| 7,303,855 B2 | 12/2007 | Hatakeyama et al. | |
| 7,358,025 B2 | 4/2008 | Hatakeyama | |
| 7,648,871 B2 | 1/2010 | Belyansky et al. | |
| 8,436,404 B2 | 5/2013 | Bohr et al. | |
| 9,276,013 B1 | 3/2016 | Doris et al. | |
| 9,299,608 B2 | 3/2016 | Wu et al. | |
| 10,026,824 B1 * | 7/2018 | Chanemougame | H01L 21/76805 |
| 10,325,819 B1 * | 6/2019 | Gao | H01L 21/823878 |
| 2005/0285175 A1 * | 12/2005 | Cheng | H01L 27/10864 257/302 |
| 2007/0090443 A1 * | 4/2007 | Choi | H01L 27/1203 257/314 |
| 2007/0173002 A1 | 7/2007 | Hall et al. | |
| 2008/0035991 A1 * | 2/2008 | Lee | H01L 27/10876 257/331 |
| 2008/0048333 A1 * | 2/2008 | Seo | H01L 27/10876 257/773 |
| 2008/0203428 A1 * | 8/2008 | Choi | H01L 29/1054 257/190 |
| 2008/0203455 A1 * | 8/2008 | Jang | H01L 27/10814 257/306 |
| 2008/0296623 A1 * | 12/2008 | Wilhelm | H01L 29/66242 257/197 |
| 2008/0303085 A1 * | 12/2008 | Jung | H01L 29/66621 257/330 |
| 2008/0303115 A1 * | 12/2008 | Miyazaki | H01L 27/11519 257/506 |
| 2012/0135605 A1 * | 5/2012 | Kim | H01L 27/10888 438/696 |
| 2013/0302959 A1 * | 11/2013 | Cheong | H01L 27/1052 438/270 |
| 2014/0117421 A1 * | 5/2014 | Seo | H01L 21/823814 257/288 |
| 2014/0264482 A1 * | 9/2014 | Li | H01L 21/76816 257/288 |
| 2015/0243884 A1 * | 8/2015 | BrightSky | H01L 45/1683 257/4 |
| 2015/0332963 A1 | 11/2015 | Wu et al. | |
| 2016/0035857 A1 * | 2/2016 | Leobandung | H01L 29/665 257/288 |
| 2016/0043170 A1 * | 2/2016 | Park | H01L 27/0924 257/369 |
| 2016/0141417 A1 * | 5/2016 | Park | H01L 21/76831 257/365 |
| 2016/0329406 A1 | 11/2016 | Fu et al. | |
| 2016/0380060 A1 * | 12/2016 | Kim | H01L 29/4925 438/586 |
| 2017/0154848 A1 * | 6/2017 | Fan | H01L 27/0207 |
| 2017/0194203 A1 * | 7/2017 | Hung | H01L 27/1104 |
| 2017/0345759 A1 * | 11/2017 | Lin | H01L 29/66795 |
| 2018/0269301 A1 * | 9/2018 | Cheng | H01L 29/66795 |
| 2018/0350969 A1 * | 12/2018 | Ching | H01L 29/1608 |
| 2019/0157434 A1 * | 5/2019 | Balakrishnan | H01L 21/743 |
| 2019/0221650 A1 * | 7/2019 | Zang | H01L 21/76897 |
| 2019/0296124 A1 * | 9/2019 | Hsu | H01L 29/785 |
| 2019/0319027 A1 * | 10/2019 | Chung | H01L 27/0207 |
| 2019/0371898 A1 * | 12/2019 | Huang | H01L 21/76843 |
| 2019/0378909 A1 * | 12/2019 | Cheng | H01L 21/7682 |
| 2020/0006139 A1 * | 1/2020 | Tseng | H01L 21/76877 |
| 2020/0051906 A1 * | 2/2020 | Liaw | H01L 21/76829 |
| 2020/0066600 A1 * | 2/2020 | Ok | H01L 21/823821 |
| 2020/0279745 A1 * | 9/2020 | Cheng | H01L 29/6653 |
| 2020/0303245 A1 * | 9/2020 | Tsai | H01L 21/76813 |
| 2020/0303373 A1 * | 9/2020 | Glass | H01L 29/205 |
| 2020/0373196 A1 * | 11/2020 | Li | H01L 21/845 |

* cited by examiner

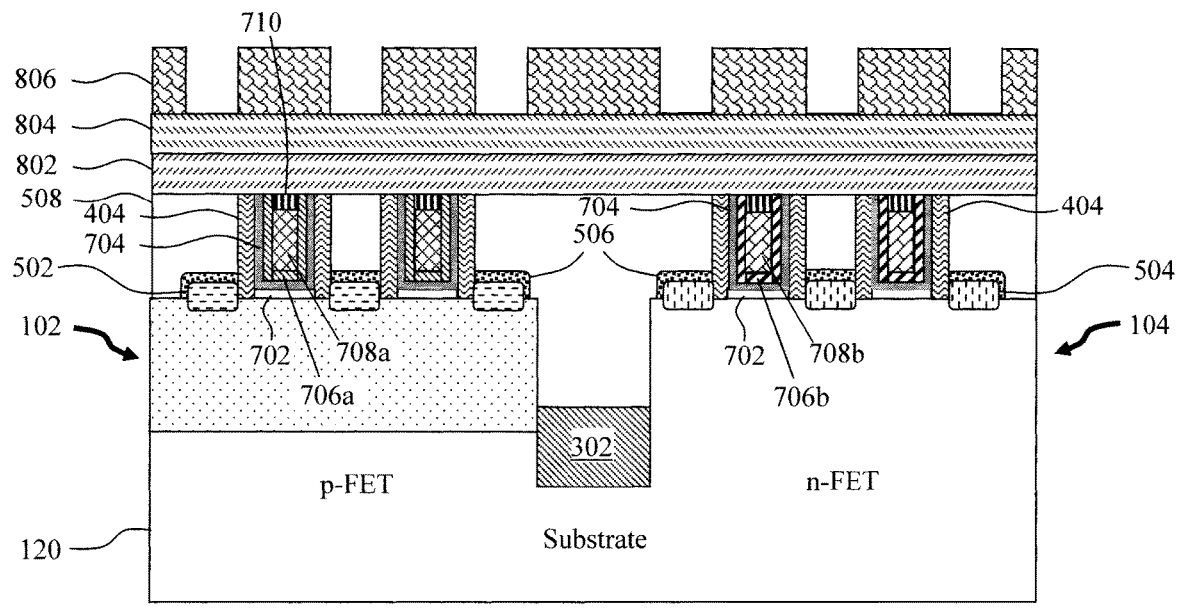
FIG. 8  B-B'
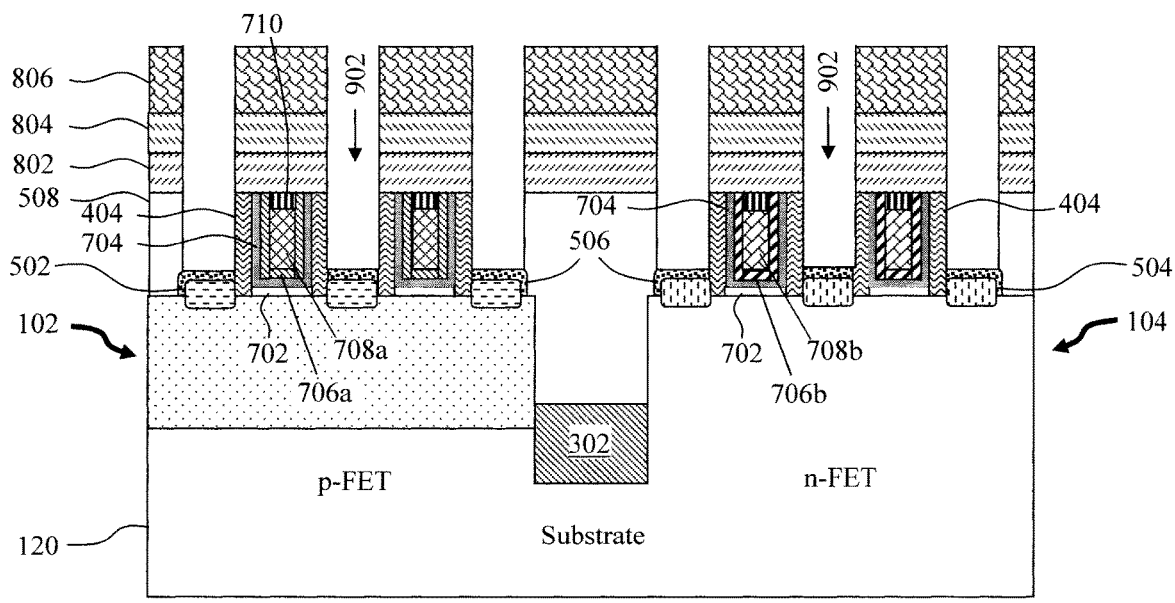
FIG. 9  B-B'

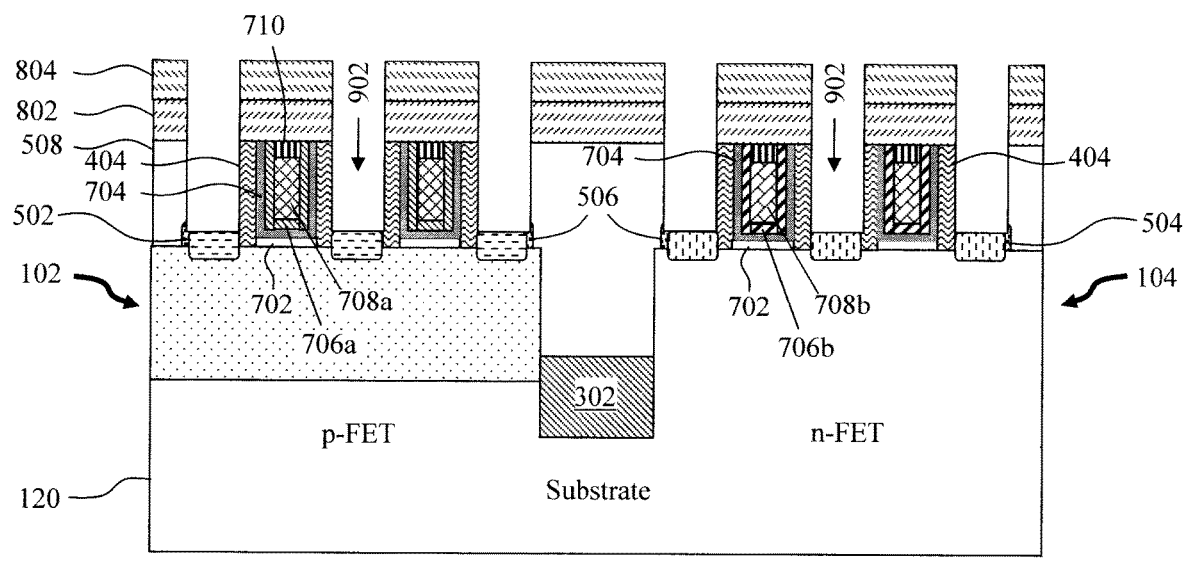
FIG. 10     B-B'
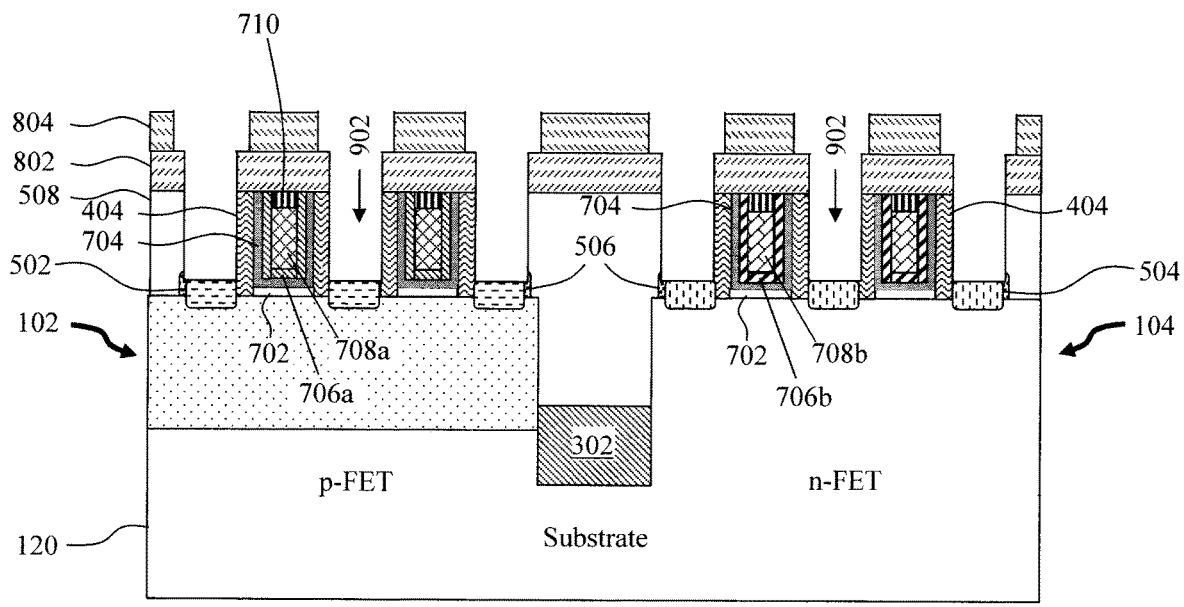
FIG. 11     B-B'

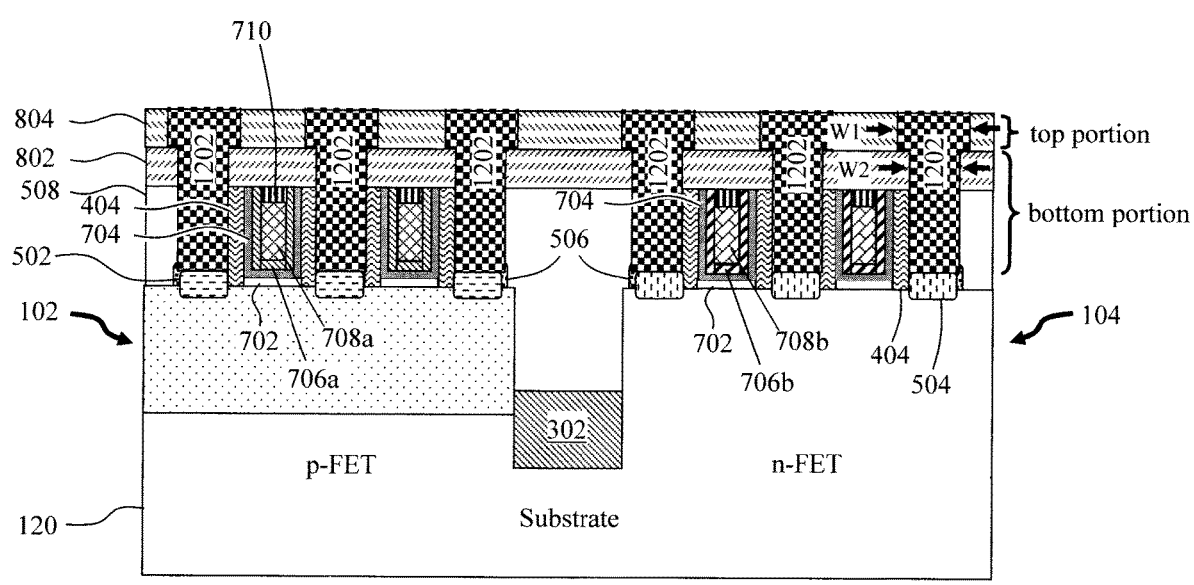
FIG. 12  B-B'

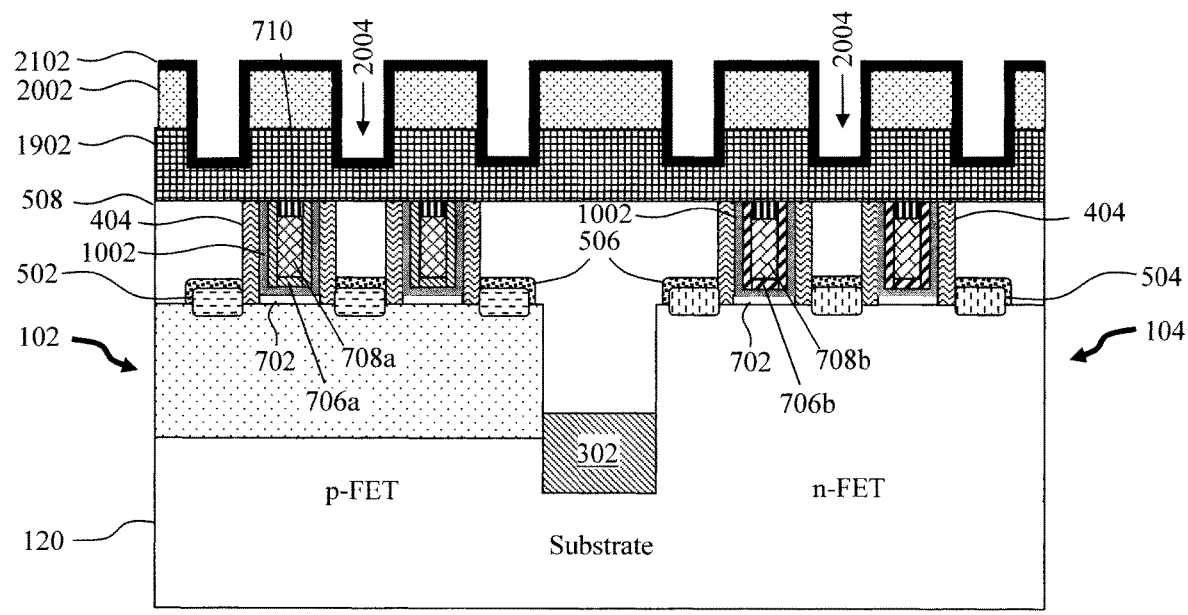
FIG. 21   B-B'
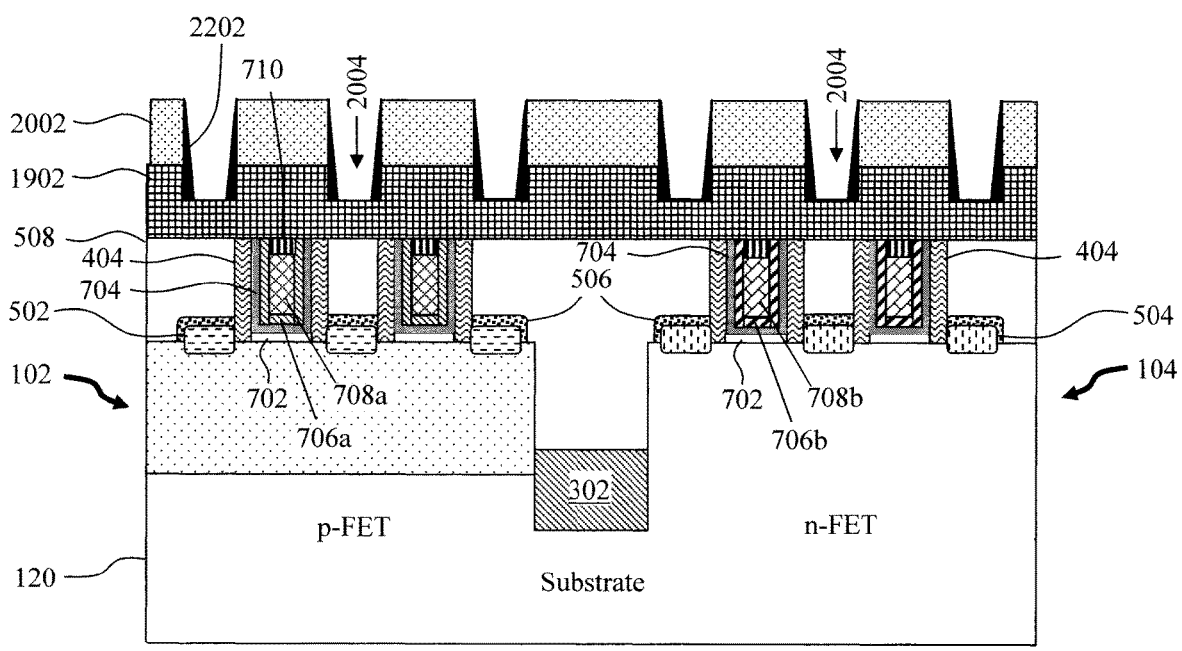
FIG. 22   B-B'

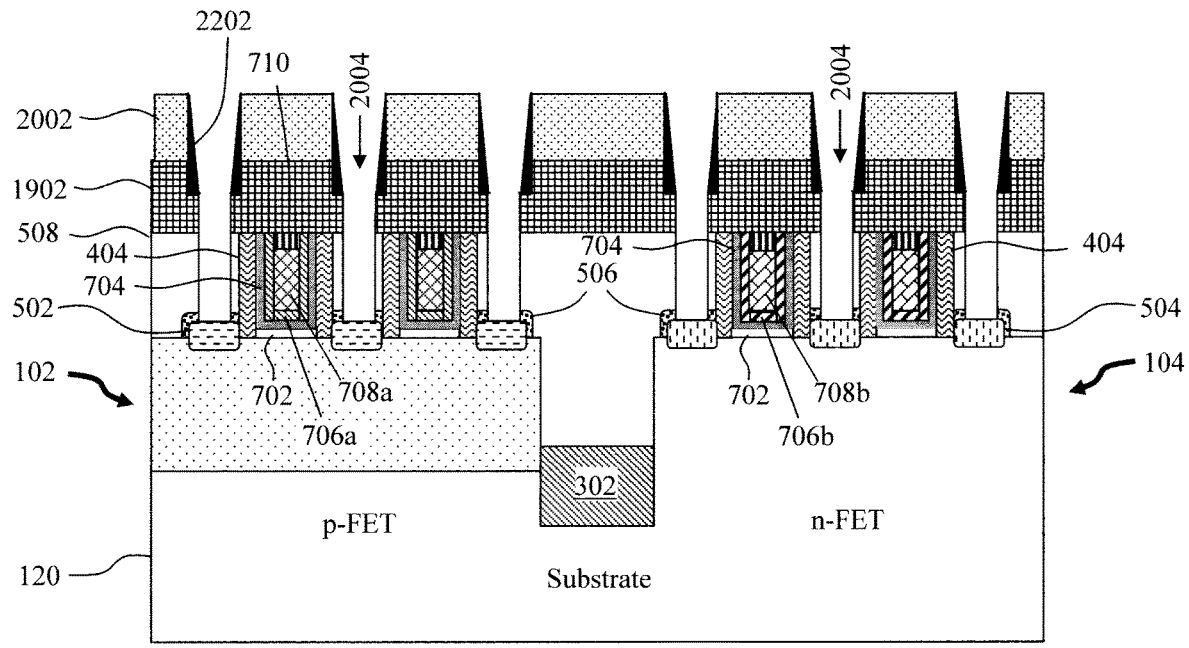
FIG. 23  B-B'
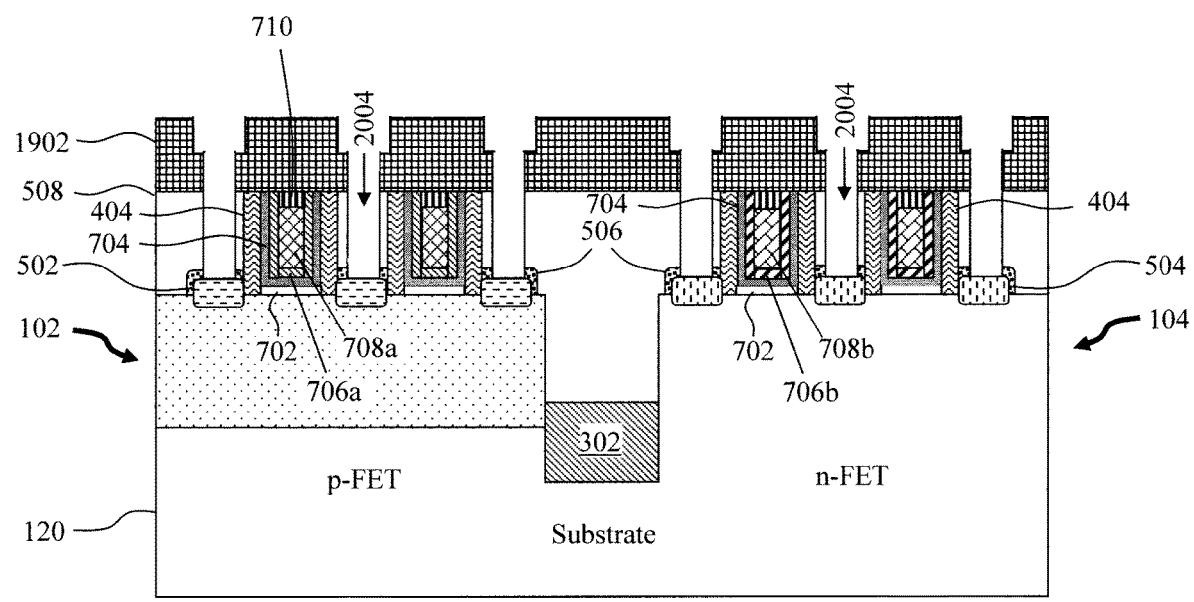
FIG. 24  B-B'

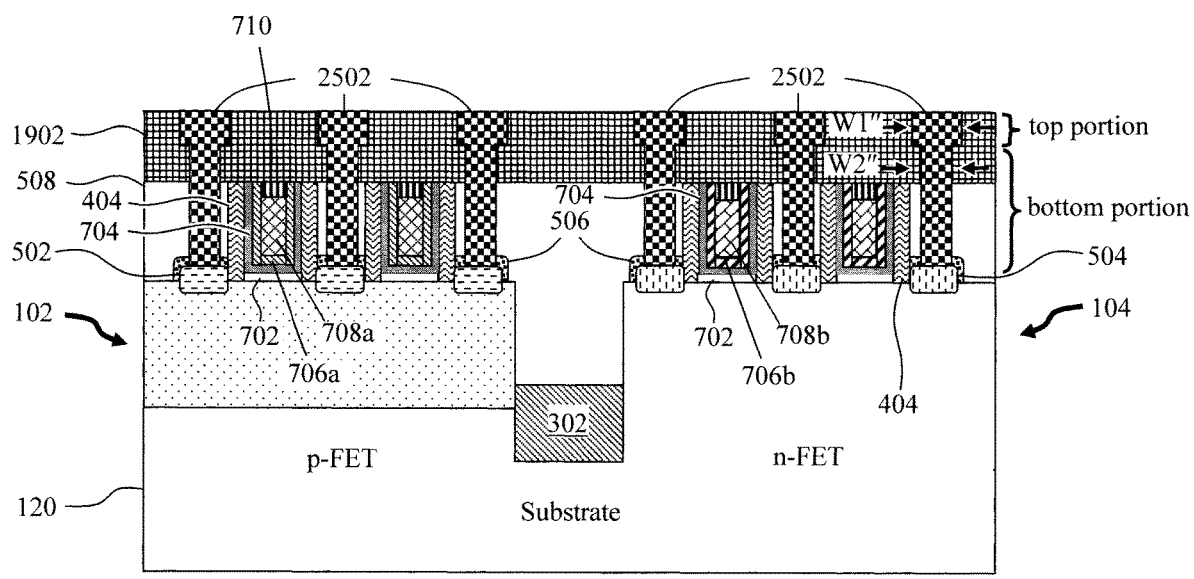
FIG. 25   B-B'

TIERED-PROFILE CONTACT FOR SEMICONDUCTOR

FIELD OF THE INVENTION

The present invention relates to contact designs for semiconductor devices, and more particularly, to tiered-profile contacts for semiconductor devices and techniques for formation thereof.

BACKGROUND OF THE INVENTION

With semiconductor device scaling, contact resistance becomes an increasingly greater concern. Basically, as devices become smaller, so do the contacts. Properly aligning with a smaller contact is challenging, and even a slight misalignment can result in an unacceptably high resistance.

Self-aligned contacts have been proposed to address this situation. See, for example, U.S. Pat. No. 8,436,404 issued to Bohr et al., entitled "Self-Aligned Contacts." This process, however, requires additional steps such as the formation of a cap layer on the gate to prevent the contact etch from exposing the gate electrode. Increasing the complexity of the fabrication increases production costs, as well as provides more opportunities for variability to be introduced into the process. As a result, the reliability of a self-aligned contact scheme for full scale production can be a concern.

Further with scaling, the contact-to-contact spacing shrinks. When forming deep contacts, the contacts typically taper with the top of the contact being significantly wider than the bottom. Thus, for a given contact-to-contact spacing, alignment with the (smaller) bottom surface of the contact is even more difficult, with proper alignment being key to meet resistance parameters.

Therefore, improved scalable contact designs for semiconductor devices would be desirable.

SUMMARY OF THE INVENTION

The present invention provides tiered-profile contacts for semiconductor devices and techniques for formation thereof. In one aspect of the invention, a method for forming tiered-profile contacts to a semiconductor device is provided. The method includes: depositing a first oxide layer over the semiconductor device; depositing a second oxide layer on the first oxide layer, wherein the second oxide layer has a greater etch rate than the first oxide layer; patterning contact trenches through the first oxide layer and the second oxide layer down to the semiconductor device, wherein a bottom portion of the contact trenches passes through the first oxide layer and a top portion of the contact trenches passes through the second oxide layer; isotropically etching the top portion of the contact trenches selective to the bottom portion of the contact trenches based on the second oxide layer having a greater etch rate than the first oxide layer to make the top portion of the contact trenches wider than the bottom portion; and filling the contact trenches with at least one contact metal to form the tiered-profile contacts to the semiconductor device.

In another aspect of the invention, another method for forming tiered-profile contacts to a semiconductor device is provided. The method includes: depositing an oxide layer over the semiconductor device; patterning contact trenches partway through the oxide layer; forming sacrificial spacers along inner sidewalls of the contact trenches which reduces a footprint of the contact trenches; complete patterning of the contact trenches between the sacrificial spacers to extend the contact trenches down to the semiconductor device, wherein a top portion of the contact trenches is wider than a bottom portion of the contact trenches; removing the sacrificial spacers; and filling the contact trenches with at least one contact metal to form the tiered-profile contacts to the semiconductor device.

In yet another aspect of the invention, a structure is provided that includes: a semiconductor device; a first oxide layer disposed over the semiconductor device; a second oxide layer disposed on the first oxide layer, wherein the second oxide layer is configured to have a greater etch rate than the first oxide layer; tiered-profile contacts extending through the first oxide layer and the second oxide layer down to the semiconductor device, wherein a bottom portion of the tiered-profile contacts passes through the first oxide layer and a top portion of the tiered-profile contacts passes through the second oxide layer, and wherein the top portion of the tiered-profile contacts is wider than the bottom portion.

In still yet another aspect of the invention, a structure is provided that includes: a semiconductor device; an oxide layer disposed over the semiconductor device; tiered-profile contacts having a top portion and a bottom portion, wherein the top portion of the tiered-profile contacts extends partway through the oxide layer and the bottom portion of the tiered-profile contacts extends a remaining way through the oxide layer and down to the semiconductor device, and wherein the top portion of the tiered-profile contacts is wider than the bottom portion of the tiered-profile contacts giving the contacts a tiered-profile.

A more complete understanding of the present invention, as well as further features and advantages of the present invention, will be obtained by reference to the following detailed description and drawings.

BRIEF DESCRIPTION OF THE DRAWINGS

FIG. 8 is a cross-sectional diagram illustrating a first oxide layer (e.g., a low etch rate (LER) oxide) having been deposited onto the dielectric, a second oxide layer (e.g., a high etch rate (HER) oxide) having been deposited onto the first oxide layer, and a patterned organic planarizing layer (OPL) having been formed on the second oxide layer according to an embodiment of the present invention;

FIG. 9 is a cross-sectional diagram illustrating contact trenches having been patterned through the first and second oxide layers and the dielectric, down to the etch stop layer according to an embodiment of the present invention;

FIG. 10 is a cross-sectional diagram illustrating the contact trenches having been extended through the etch stop layer and down to the source and drains, and the OPL having been removed according to an embodiment of the present invention;

FIG. 11 is a cross-sectional diagram illustrating the top portion of the contact trenches having been isotropically etched in the second oxide layer according to an embodiment of the present invention;

FIG. 12 is a cross-sectional diagram illustrating the contact trenches having been filled with a contact metal(s) forming tiered-profile contacts according to an embodiment of the present invention;

FIG. 21 is a cross-sectional diagram illustrating a spacer material having been conformally deposited lining the (partial) contact trenches according to an embodiment of the present invention;

FIG. 22 is a cross-sectional diagram illustrating the spacer material having been patterned into individual (sacrificial) spacers lining the inner sidewalls of the (partial) contact trenches according to an embodiment of the present invention;

FIG. 23 is a cross-sectional diagram illustrating the etch of the contact trenches having been completed between the spacers to extend the contact trenches the remaining way through the oxide layer and down to the source and drains according to an embodiment of the present invention;

FIG. 24 is a cross-sectional diagram illustrating the patterned OPL and spacers having been removed according to an embodiment of the present invention; and FIG. 25 is a cross-sectional diagram illustrating the first and second contact trenches having been filled with a contact metal(s) forming tiered-profile contacts according to an embodiment of the present invention.

DETAILED DESCRIPTION OF PREFERRED EMBODIMENTS

Provided herein are techniques for forming tiered-profile contacts in a semiconductor device. By "tiered-profile" it is meant that the contacts formed in accordance with the present techniques have a distinct top portion and bottom portion. Further, the top portion has a larger critical dimension than the bottom portion such that, when viewed in cross-section, the contacts have a shape resembling the letter 'T', i.e., the contacts are T-shaped. Advantageously, the bottom portion provides a reduced footprint for contacting smaller device components, while the larger top portion provides a greater access area to the contact minimizing the risk of misalignment and thus overall contact resistance issues. Several different approaches are contemplated herein for forming the present tiered-profile contacts.

In a first approach, a dual layer oxide is employed having differential etch rates such that the top portion of the contact is expanded to create the distinctive T-shaped tiered design. This approach is now described by way of reference to FIGS. 1-12 which illustrate an exemplary methodology for forming a semiconductor device and for forming tiered-profile contacts to the semiconductor device.

Figure 1:
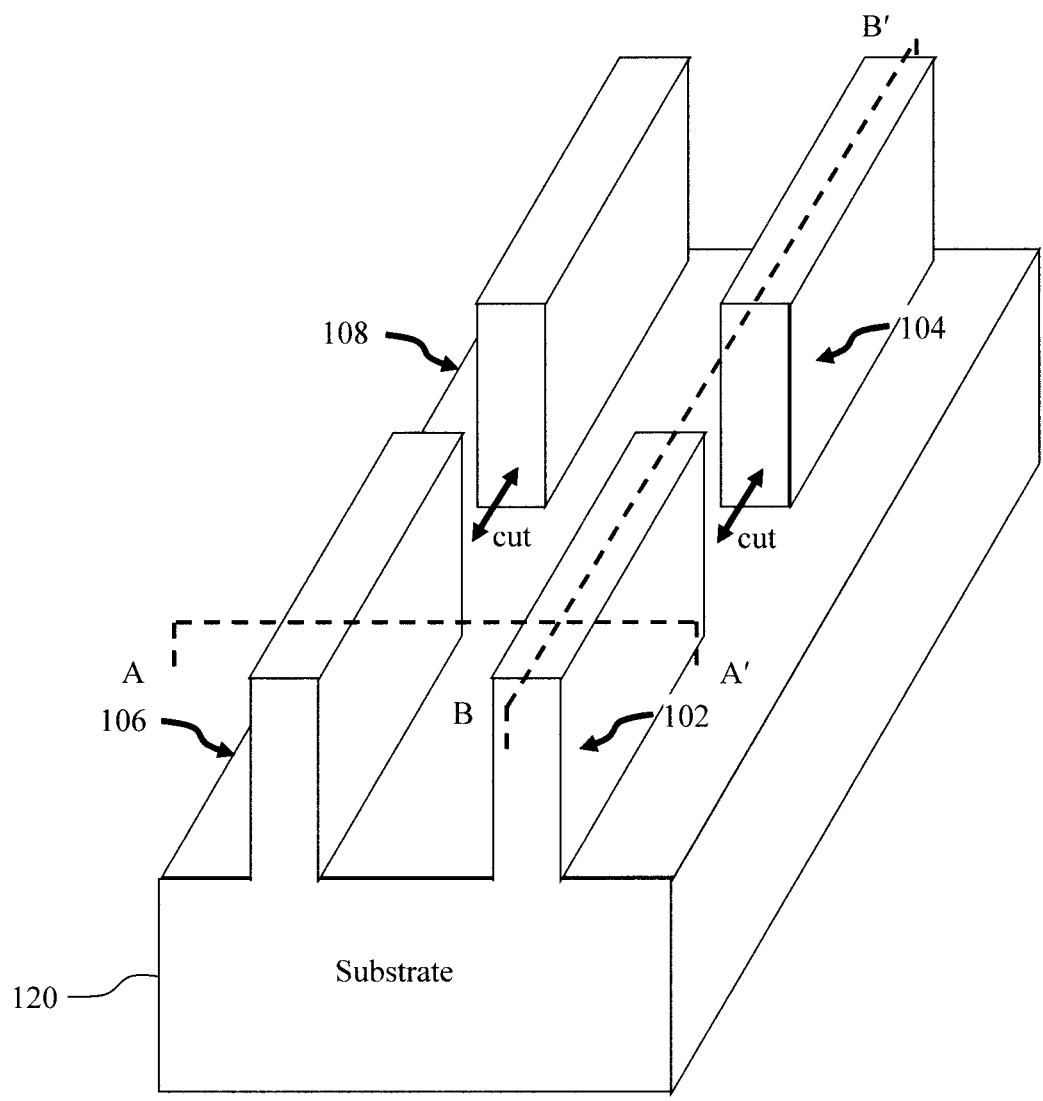
FIG. 1 is a three-dimensional diagram illustrating a plurality of fins having been patterned in a substrate according to an embodiment of the present invention.

As shown in FIG. 1 (a three-dimensional view), the process begins by patterning a plurality of fins in a substrate 120. See, for example, FIG. 1 where fins 102-108 have been patterned in the substrate 120. Of course, the number of fins formed at this stage depends on the particular device being fabricated, and more (or fewer) fins can be formed than is shown in FIG. 1. According to an exemplary embodiment, a sea of fins is first patterned in the substrate 120, and then cut into the individual fins 102-108 shown in FIG. 1. Standard lithography and etching techniques may be employed for the fin patterning.

A variety of different substrate configurations can be implemented in accordance with the present techniques. For instance, according to one exemplary embodiment, the substrate is a bulk semiconductor wafer, such as a bulk Si, bulk Ge, and/or bulk SiGe semiconductor wafer. Alternatively, the substrate can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, and/or SiGe semiconductor.

The following description will reference various cross-sectional views of cuts through the device structure as shown in FIG. 1. For instance, a cross-sectional view A-A' depicts a cut perpendicular to the fins, through adjacent fins (i.e. fins 102 and 106 in this example), whereas a cross-sectional view B-B' depicts a cut parallel to the fins, though fins arranged lengthwise in front of/behind the other (i.e., fins 102 and 104 in this example).

In the instant example, a configuration is employed wherein fins of at least two different channel materials are present in the device. By way of example only, silicon (Si) can be employed as one channel material and silicon germanium (SiGe) as the other. This type of dual channel design is advantageous in forming tensile-strained Si fins for n-channel field-effect transistors (n-FETs) and compressively-strained SiGe fins for p-channel FETs (p-FETs).

Figure 2:
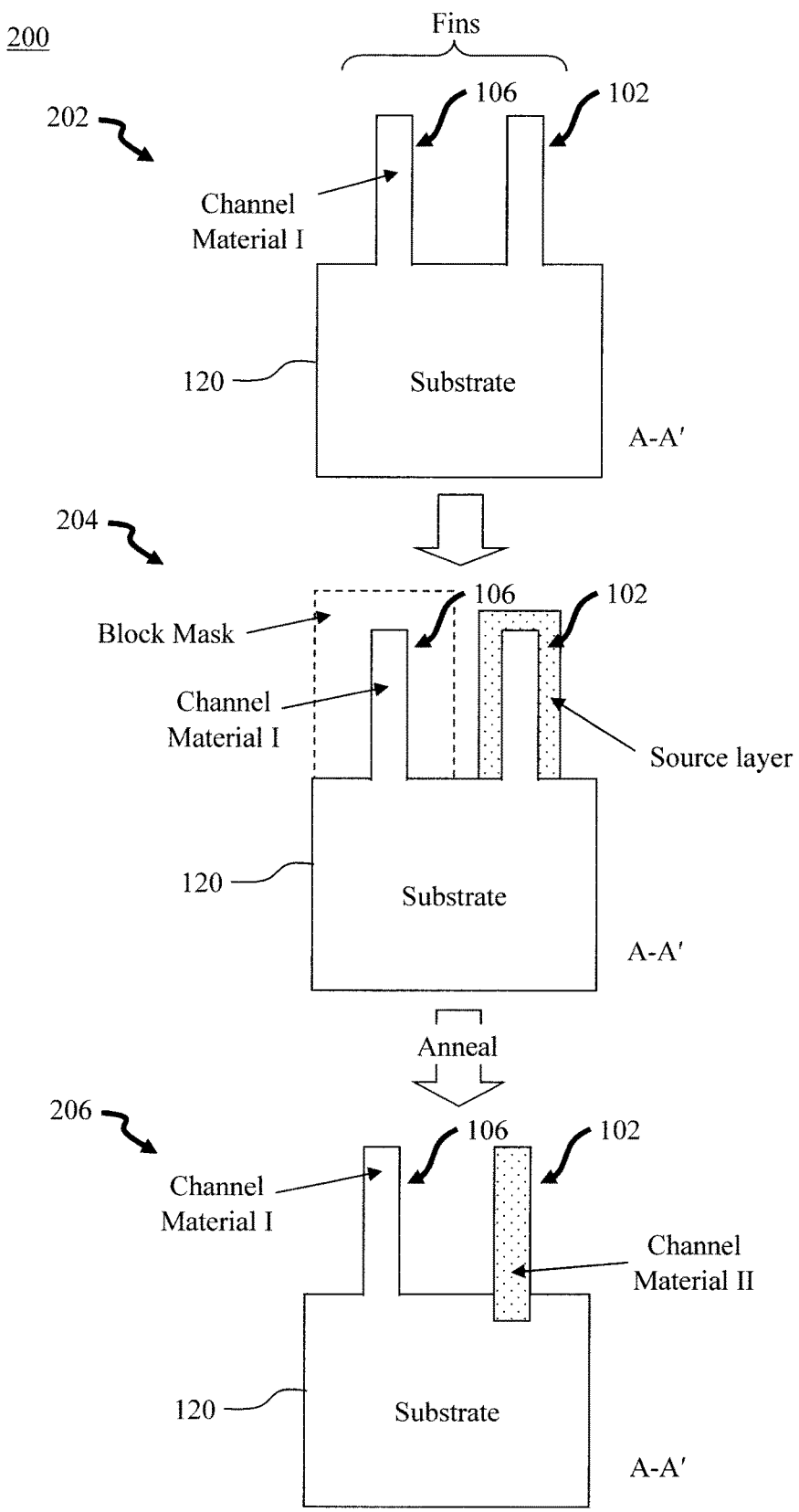
FIG. 2 is a diagram illustrating an exemplary methodology for forming dual fin channels on a common substrate according to an embodiment of the present invention.

A variety of different processes can be employed to form dual fin channels (i.e., fins formed from at least two different channel materials) on a common substrate. One approach is now described by way of reference to methodology 200 of FIG. 2. As shown in FIG. 2, in step 202, the process begins with the fins having been patterned in substrate 120. FIG. 2 depicts cross-sectional views A-A' perpendicular to the fins, through fins 102 and 106. In this example, substrate 120 is formed from a first one of the channel materials (Channel Material I). For instance, the substrate can be formed from Si.

Thus at this stage, the as-patterned fins all contain the same Channel Material I, e.g., Si. Ultimately, the goal will be to end up with at least one fin containing the Channel Material I, and at least one other fin containing a different channel material (Channel Material II) such as SiGe. This will be done by selectively converting some of the, e.g., Si fins to SiGe fins. Thus, as shown in step 204, those fins (fin 106 in this view) that are to remain Si fins are masked using, for example, a standard block mask. The fins that are unmasked (fin 102 in this view) are those that will be converted to the second channel material (Channel Material II), and a source layer for the second channel material is deposited onto the unmasked fins.

For instance, in the case of as-patterned Si fins, a SiGe source layer will serve as a source of Ge atoms that can be driven into the Si fins to convert them into SiGe fins. Only those fins that have the source layer will be converted. The block mask can be removed after deposition of the source layer, or optionally after the drive-in anneal that is performed in the next step.

Namely, in step 206 an anneal is performed to drive atoms from the source layer into the respective fin(s) (fin 102 in this view). According to an exemplary embodiment, this drive-in anneal is performed at a temperature of from about 850° C. to about 1100° C., and ranges therebetween. Again, using the example of as-patterned Si fins and a SiGe source layer, this anneal will serve to drive Ge atoms from the source layer into the respective Si fin(s) (fin 102 in this view) to convert them into SiGe fins. As a result, fins will now be present on the substrate formed from two different channel materials, i.e., Channel Material I and Channel Material II—such as Si and SiGe, respectively. This process for forming dual channel material fins is also described in U.S. Pat. No. 9,276,013 issued to Doris et al., entitled "Integrated Formation of Si and SiGe Fins," the contents of which are incorporated by reference as if fully set forth herein.

Figure 3:
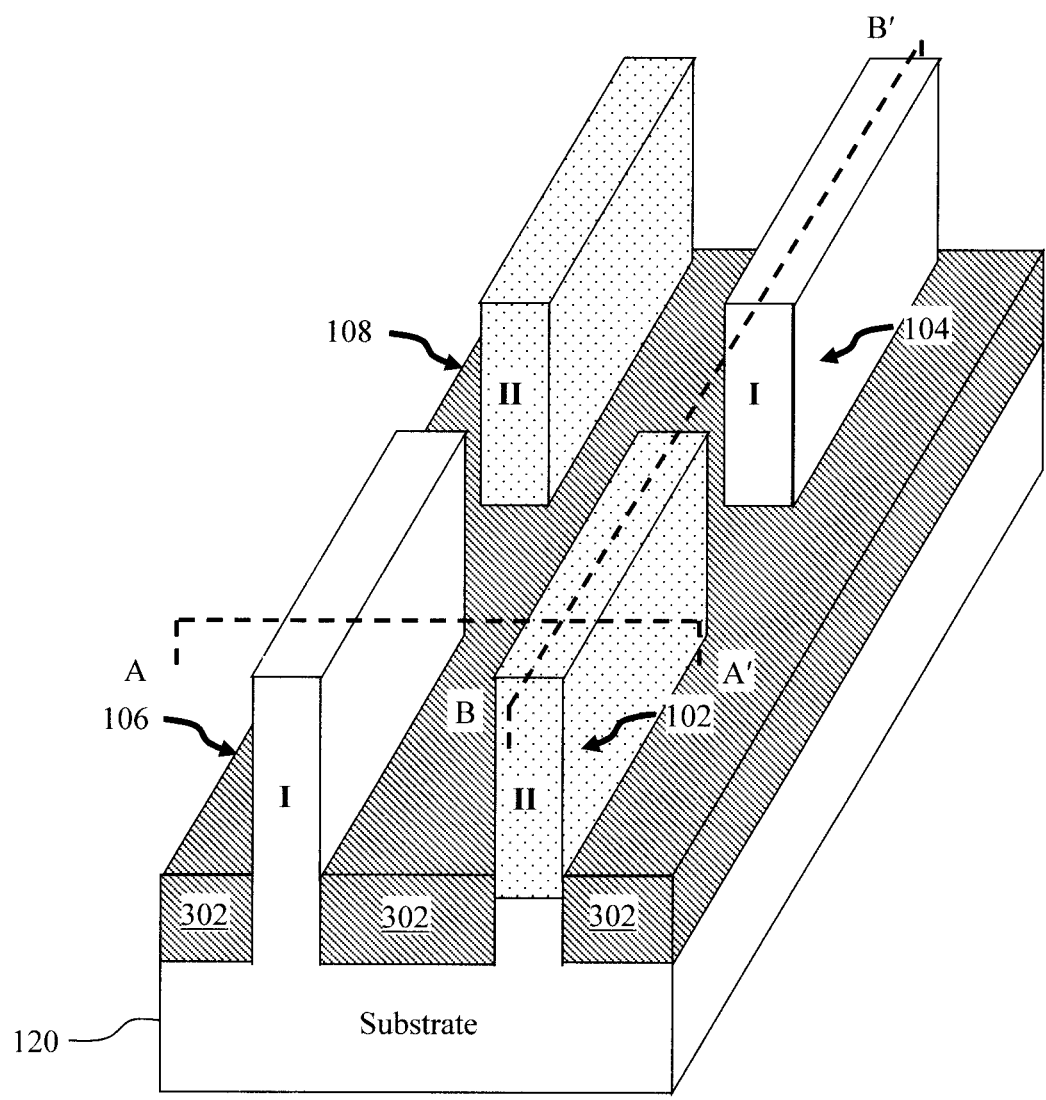
FIG. 3 is a three-dimensional diagram illustrating dual fin channels having been formed on the substrate, and shallow trench isolation (STI) regions having been formed between the fins according to an embodiment of the present invention.

Referring again to a three-dimensional view, as shown in FIG. 3 by way of the above-described process, fins containing the Channel Material I and fins containing the Channel Material II (labeled I and II), e.g., Si and SiGe, respectively, are now present on the substrate 120. Further, FIG. 3 illustrates how, according to an exemplary embodiment, the fins can be configured on the substrate 120 with one type of fin (Channel Material I or Channel Material II) arranged lengthwise in front of/behind the other. Thus, for instance, when Channel Material I and Channel Material II are Si and SiGe, respectively, from left to right there is a SiGe fin (Channel Material II) behind a Si fin (Channel Material I). The next fins over would have the opposite orientation, i.e., G. Si fin (Channel Material I) behind a SiGe fin (Channel Material II) in order to provide a dual channel for adjacent devices.

Shallow trench isolation (STI) regions 302 are then formed in the substrate 120 between the fins. See FIG. 3. STI involves patterning trenches in the substrate 120 between the fins, and then filling the trenches with an insulator, such as an STI oxide. STI regions 302 electrically isolate the fins.

In this exemplary embodiment, a replacement metal gate process flow is employed. Early in a replacement metal gate process a sacrificial dummy gate is placed over a channel region of the device. This dummy gate is later removed and replaced with a final metal gate of the device, also called a replacement gate. Thus, the dummy gate serves merely as a placeholder over the channel region and permits processes such as the formation of the source and drain to be performed without exposing the replacement gate to potentially damaging conditions (such as elevated temperatures) that can harm device performance.

Figure 4:
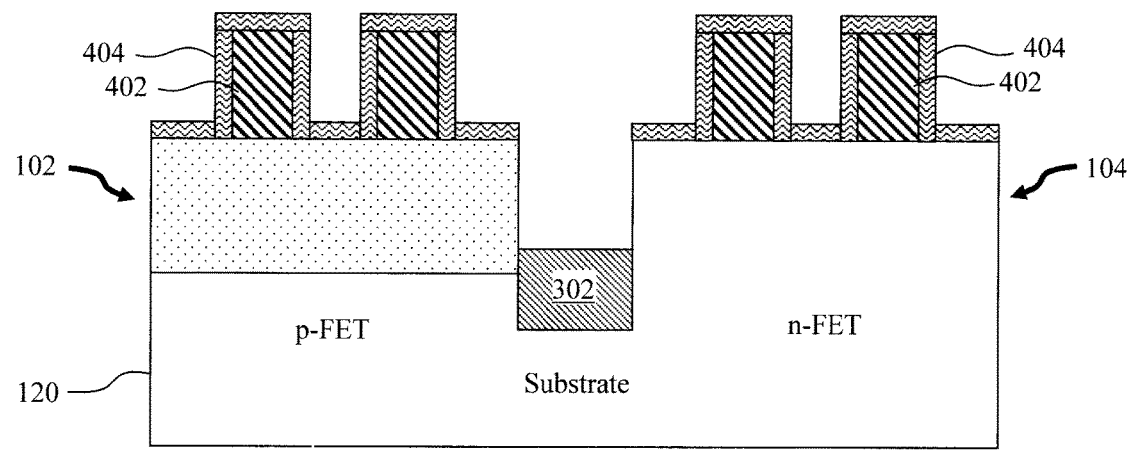
FIG. 4 is a cross-sectional diagram illustrating dummy gates having been formed over the fins and spacers having been formed over the dummy gates according to an embodiment of the present invention.

Switching to a cross-sectional view B-B' parallel to the fins through fins 102 and 104, as shown in FIG. 4 the replacement gate process begins with the formation of dummy gates 402 over the fins (fins 102 and 104 in this view). The dummy gates 402 are formed by first depositing a suitable dummy gate material over the fins, and then using standard lithography and etching techniques to pattern the dummy gate material into the individual dummy gates 402 shown in FIG. 4. Suitable dummy gate materials include, but are not limited to, poly-silicon (poly-Si) and/or amorphous Si. As shown in FIG. 4, in the present example, the dummy gates 402 correspond to at least one n-FET device and at least one p-FET device.

Gate spacers 404 are then deposited over the dummy gates 402 using a conformal process such as chemical vapor deposition (CVD) or atomic layer deposition (ALD). Suitable materials for the gate spacers 404 include, but are not limited to, silicon nitride (SiN), siliconborocarbonitride (SiBCN), silicon oxycarbonitride (SiOCN) and/or silicon carbide nitride (SiCN). The gate spacers 404 serve to offset the gates (dummy gates/replacement gates) from the source and drains.

Namely, with the dummy gates 402 and gate spacers 404 in place, source and drains 502 (p-FET) and 504 (n-FET) are formed on opposite sides of the dummy gates 402. See FIG. 5. Prior to forming the source and drains 502 and 504, the gate spacers are first removed from horizontal surfaces, e.g., using a directional etching process such as reactive ion etching or RIE. Source and drains 502 and 504 can be formed from an epitaxial material that is doped in-situ (dopant introduced during growth) or ex-situ (e.g., via ion implantation). Suitable n-type dopants include, but are not limited to, phosphorous and arsenic. Suitable p-type dopants include, but are not limited to, boron. According to an exemplary embodiment, the (p-FET) source and drains 502 are formed from boron-doped SiGe (SiGe:B) and the (n-FET) source and drains 504 are formed from phosphorus-doped Si (Si:P).

Preferably, a contact etch stop layer 506 is then formed over the source and drains 502 and 504. Layer 506 will serve as an etch stop when the present T-shaped contacts are formed to the source and drains 502 and 504. Suitable materials for the contact etch stop layer 506 include, but are not limited to, SiN, SiBCN, SiOCN, and/or SiCN.

Figure 5:
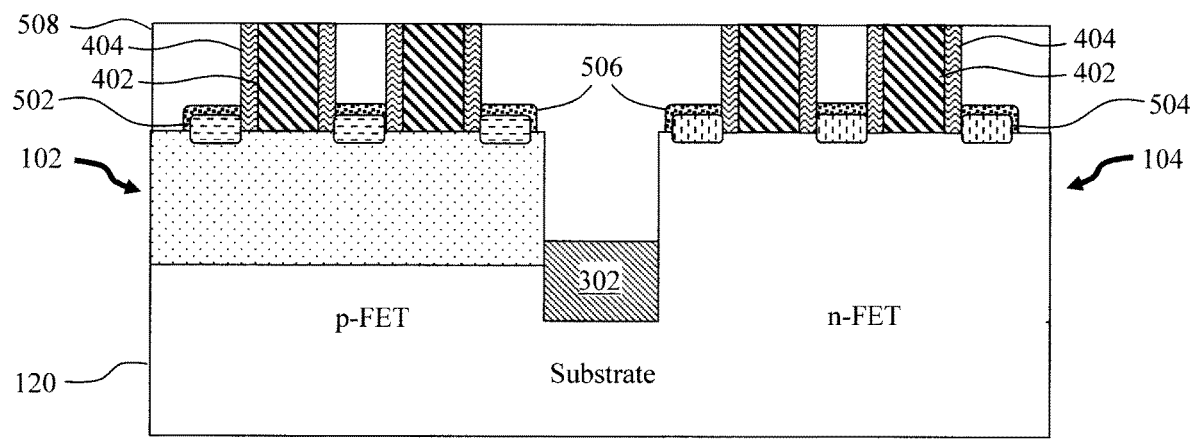
FIG. 5 is a cross-sectional diagram illustrating source and drains having been formed on opposite sides of the dummy gates, a contact etch stop layer having been formed over the source and drains, and the dummy gates having been buried in a dielectric which is polished down to the dummy gates according to an embodiment of the present invention.

The dummy gates 402 are next buried in a dielectric 508. The dielectric 508 enables the dummy gates 402 to be removed and a replacement gate to be formed in their place. As shown in FIG. 5, the as-deposited dielectric 508 is polished down to the dummy gates 402 using a process such as chemical-mechanical polishing (CMP). This polishing exposes the tops of the dummy gates 402, enabling the dummy gates 402 to be removed selective to the dielectric 508.

Figure 6:
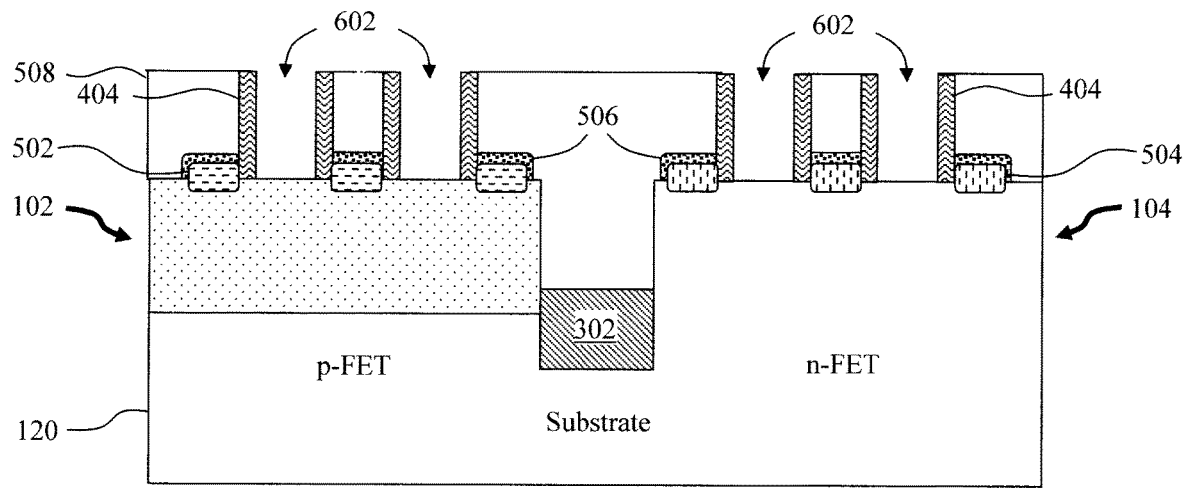
FIG. 6 is a cross-sectional diagram illustrating the dummy gates having been removed forming gate trenches in the dielectric according to an embodiment of the present invention.
Figure 7:
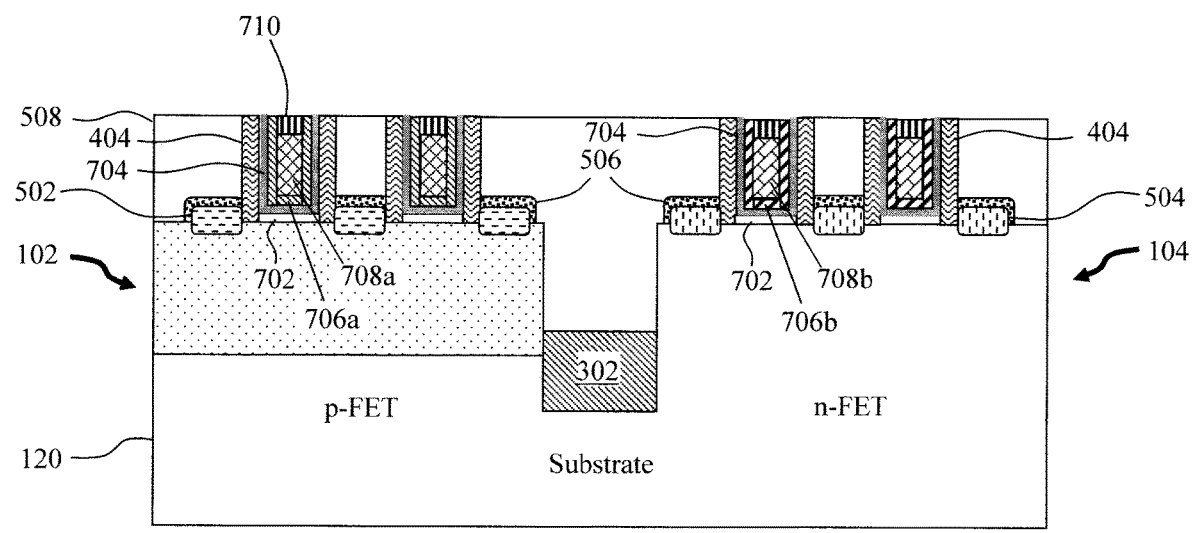
FIG. 7 is a cross-sectional diagram illustrating an interfacial layer (IL) having been formed in the gate trenches on the exposed fins, a conformal gate dielectric having been deposited in the gate trenches over the IL, and a conformal workfunction-setting metal layer having been deposited onto the gate dielectric followed by a fill metal and a gate cap according to an embodiment of the present invention.

Namely, as shown in FIG. 6, the dummy gates 402 are removed (using, for example, a Si-selective etching process) selective to the dielectric 508, forming gate trenches 602 in the dielectric 508. Replacement metal gates will be formed in the gate trenches 602. As described in detail below, the replacement metal gates will include a metal or combination of metals over a gate dielectric. However, prior to depositing the gate dielectric, an interfacial layer (IL) 702 is formed in the gate trenches 602 on the exposed fin channels by, e.g., an oxidation process. See FIG. 7.

A conformal gate dielectric 704 is then deposited into the gate trenches 602 over the interfacial layer 702, followed by a conformal workfunction-setting metal layer 706a (p-FET) or 706b (n-FET) being deposited over the gate dielectric 704, and then a fill metal 708a (p-FET) or 708b (n-FET). See FIG. 7. Suitable gate dielectrics include, but are not limited to, high-κ materials such as hafnium oxide ($HfO_2$) and/or lanthanum oxide ($La_2O_3$). The term "high-κ" as used herein refers to a material having a relative dielectric constant κ which is much higher than that of silicon dioxide (e.g., a dielectric constant κ=25 for $HfO_2$ rather than 4 for silicon dioxide).

The particular workfunction-setting metal employed can vary depending on whether an n-type or p-type device is desired. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and tungsten (W). TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents. Thus, there is some overlap in the exemplary n- and p-type workfunction-setting metals given above. Suitable fill metals 708a/708b include, but are not limited to, tungsten (W) for both n-FET and p-FET devices.

The fill metal 708a/708b is capped with a gate cap 710. The gate cap 710 serves to protect the replacement gate during subsequent processing. Suitable materials for the gate cap 710 include, but are not limited to, nitride materials such as silicon nitride (SiN).

The present T-shaped tiered contacts are next formed to the source and drains 502 and 504. In this particular example, the distinctive T-shaped design of the contacts is created by leveraging the differential etch rate of dual oxide layers deposited over the (e.g., p-FET and n-FET) devices. More specifically, the dual oxide layers include a relatively higher etch rate (HER) oxide over a relatively lower etch rate (LER) oxide. Based on the differential etch rate between these oxide layers, the HER oxide can be opened by a greater amount than the LER oxide creating the T-shaped tiered contact design.

Thus, referring to FIG. 8, a first oxide layer 802 is deposited onto the dielectric 508 over the p-FET and n-FET devices, and a second oxide layer 804 is deposited onto the first oxide layer 802. According to an exemplary embodiment, the first oxide layer 802 and the second oxide layer 804 are each deposited to a thickness of from about 20 nanometers (nm) to about 30 nm, and ranges therebetween. Generally, the first/second oxide layers 802/804 can be formed from any oxides of which the etch rate can be controlled by doping or deposition condition. By way of example only, suitable materials for the first/second oxide layers 802/804 include, but are not limited to, silicon dioxide ($SiO_2$) and/or spin on glass (i.e., $SiO_2$ with dopants), flowable oxides (such as hydrogen silsesquioxane (HSQ) in methyl isobutyl ketone), undoped silicon glass (USG), borophosphosilicate glass (BPSG), phosphosilicate glass (PSG). The first oxide layer 802 has a lower etch rate than the second oxide layer 804, and vice versa. This means that when an etchant is used on these layers, it will etch the second oxide layer 804 at a greater rate than the first oxide layer 802, and vice versa.

Factors such as the composition, density and/or impurities, etc. can be used to selectively tailor the etch rate in the first versus second oxide layers 802/804. For instance, a spin on glass material has a higher etch rate than pure $SiO_2$. Thus, by way of example only, the first oxide layer 802 can be $SiO_2$, while the second oxide layer 804 is spin on glass.

Further, increasing/decreasing the quality or porosity of an oxide decreases/increases the etch rate, respectively. The quality (porosity) of the first/second oxide layers 802/804 can be controlled, for example, by varying the deposition conditions such as temperature and gas chemistry. For instance, a CVD oxide deposited at a higher temperature (e.g., from about 300° C. to about 450° C. and ranges therebetween) will have a higher oxide quality than the same CVD oxide deposited at a lower temperature (e.g., from about 50° C. to about 300° C. and ranges therebetween). Thus, when a CVD oxide is used to form the first and second oxide layers 802/804, a different deposition temperature can be employed to change the quality (and hence the etch rate) of the layers relative to one another. For instance, a (higher) temperature of from about 300° C. to about 450° C. and ranges therebetween can be employed during deposition of the CVD oxide for the first oxide layer 802, and a (lower) temperature of from about 50° C. to about 300° C. and ranges therebetween can be employed during deposition of the CVD oxide for the second oxide layer 804.

Some exemplary LER oxides for the first oxide layer include, but are not limited to:

Any CVD or ALD deposited silicon oxide deposited at a higher temperature with a given gas chemistry with respect to the HER silicon oxides deposited at a lower temperature with the same gas chemistry.

Any CVD or ALD deposited silicon oxide with plasma assisted (e.g., plasma-enhanced CVD (PECVD), high-density plasma CVD (HDPCVD), etc.) for oxide quality.

Any CVD or ALD deposited $SiO_2$ with an impurity or impurities such as hydrogen (H), nitrogen (N), germanium (Ge) and/or silicon (Si) or any other element that reduces the wet/dry etch rate Some exemplary HER oxides for the first oxide layer include, but are not limited to:

Any CVD or ALD silicon oxide deposited at a lower temperature with a given gas chemistry with respect to the LER silicon oxides deposited at a higher temperature with the same gas chemistry.

Any CVD or ALD deposited S102 with an impurity or impurities such as boron (B), carbon (C), phosphorous (P) and/or fluorine (F) or any other element that enhances the wet/dry etch rate.

Spin on Glass Material.

In general, the goal is to combine LER/HER oxides for first/second oxide layers 802/804 by matching an LER oxide with a certain etch rate R1 (dry or wet) and an HER oxide with an etch rate R2 that is larger than R1, i.e., R2>R1. Further, the material selection can be based on the amount by which R2 exceeds R1, which impacts the difference in the feature sizes patterned in the layers. Take for instance the present T-shaped tiered contact design which has a (narrower) bottom portion patterned in the LER oxide/first oxide layer 802 and a (wider) top portion patterned in the HER oxide/second oxide layer 804. The amount by which a desired width of the top portion exceeds that of the bottom portion can factor into selecting the LER/HER oxides that provide a corresponding etch rate difference. Thus, for example, if one wants the top portion of the tiered contact to be 10% larger than the bottom portion, LER/HER oxides can be selected with a 10% difference in their etch rates.

The width of the enlarged top portion patterned in the HER should match the dimensions of the metal contact (via) from the upper level that will land on this tiered profile, T-shaped contact. Being able to control the width of the enlarged top portion patterned in the HER to align with the metal contact (via) is beneficial in case the process changes to optimize the performance (usually bigger contacts mean lower resistance and thus higher performance) or yield (smaller contact size for less shorting defect thus higher yield).

Another consideration is the dielectric constant κ-value of the overall LER/HER stack. A dielectric constant κ=3.9 for ideal $SiO_2$, where low-k usually means higher porosity and higher etch rate. If the parasitic capacitance matters, then the overall κ-value needs to be reduced. For instance, the LER (having a κ-value close to the ideal 3.9) can be replaced by lower-κ value material. In that case, the HER should also be replaced to maintain the etch rate delta between the newly introduced LER.

An organic planarizing layer (OPL) 806 is next deposited on the second oxide layer 804, and standard lithography and etching techniques are used to pattern the OPL 806 with the footprint and location of the contacts. See FIG. 8. According to an exemplary embodiment, OPL 806 contains an aromatic cross-linkable polymer (e.g., naphthalene-based) in a solvent.

Other suitable materials for use in the OPL 806 include but are not limited to those materials described in U.S. Pat. No. 7,037,994 issued to Sugita et al. entitled "Acenaphthylene Derivative, Polymer, and Antireflection Film-Forming Composition," U.S. Pat. No. 7,244,549 issued to Iwasawa et al. entitled "Pattern Forming Method and Bilayer Film," U.S. Pat. No. 7,303,855 issued to Hatakeyama et al. entitled "Photoresist Undercoat-Forming Material and Patterning Process" and U.S. Pat. No. 7,358,025 issued to Hatakeyama entitled "Photoresist Undercoat-Forming Material and Patterning Process." The contents of each of the foregoing patents are incorporated by reference herein.

The patterned OPL 806 is then used to etch contact trenches 902 through the first/second oxide layers 802/804 and the dielectric 508, down to the source and drains 502 and 504. See FIG. 9. According to an exemplary embodiment, a directional/anisotropic etching process such as reactive ion etching (RIE) is used. The etch rate differences between the first/second oxide layers 802/804 will not affect the contact trench dimensions at this stage in the process since the etch is directional and being performed through the patterned OPL 806. However, as will be described in detail below, a non-directional/isotropic etching process will later be used to expand the top portion of the contact trenches 902 in the second oxide layer 804 (based on its differential etch rate as compared to the first oxide layer 802).

Further, as shown in FIG. 9, a first etch step can be employed to form the contact trenches 902 down to the etch stop layer 506, which is in place over the source and drains 502 and 504. As shown in FIG. 10, a second etch step, which is more finely controlled than the first, can then be used to extend the contact trenches 902 through the etch stop layer 506, exposing the source and drains 502 and 504. Following the contact trench etch, the OPL 806 is removed. See FIG. 10.

A non-directional/isotropic etching process is then used to laterally expand the top portion of the contact trenches 902 in the second oxide layer 804. See FIG. 11. As described above, this lateral etching of the second oxide layer 804 (selective to the first oxide layer 802) is possible based on the differential etch rate between the two oxide layers. Namely, the HER oxide of the second oxide layer 804 etches at a greater rate than the LER oxide of the first oxide layer 802. As a result, the lateral expansion of the contact trenches 902 during the isotropic etching process occurs primarily in the second oxide layer 804. Suitable isotropic etching processes include, but are not limited to, wet etching process such as diluted hydrofluoric acid (dHF) and dry etching processes such as $CF_4+O_2$, $CHF_3+O_2$, $CHF_3+CF_4$, $CH_3F$, $C_2F_6+SF_6$, $C_3F_8$. The contact trenches 902 now have a shape that, when filled with a contact metal(s), will result in the present T-shaped tiered contact designs. This top portion enlargement step can be an additional step to the conventional contact clean process or merged with the conventional contact clean process.

Namely, as shown in FIG. 12, the contact trenches are next filled with a contact metal(s) forming T-shaped tiered contacts 1202. Suitable contact metals include, but are not limited to, tungsten (W), copper (Cu), cobalt (Co), ruthenium (Ru), rhodium (Rh), nickel (Ni), platinum (Pt) and/or palladium (Pd) with proper barrier/liner process before filling the contact with the contact metal. When viewed in cross-section (as in FIG. 12), the T-shaped tiered contacts 1202 have a top portion with a width W1 that is greater than a width W2 of a bottom portion thereof, i.e., W1>W2.

With smaller feature sizes, the resolution of the lithography tool might require that the contact trench lithography and etching be performed in multiple iterations. For instance, by way of example only, FIGS. 13-18 depict an exemplary scenario where a LELE (i.e., Litho-Etch-Litho-Etch) patterning scheme is employed. In this example, a first lithography and etching is performed to pattern every other contact trench. Those contact trenches are then masked, and a second lithography and etching is performed to pattern the contact trenches that were skipped in the first pass. The subsequent isotropic lateral etch at the tops of the contact trenches and the contact metal fill are performed collectively once all of the contact trenches have been patterned.

Figure 13:
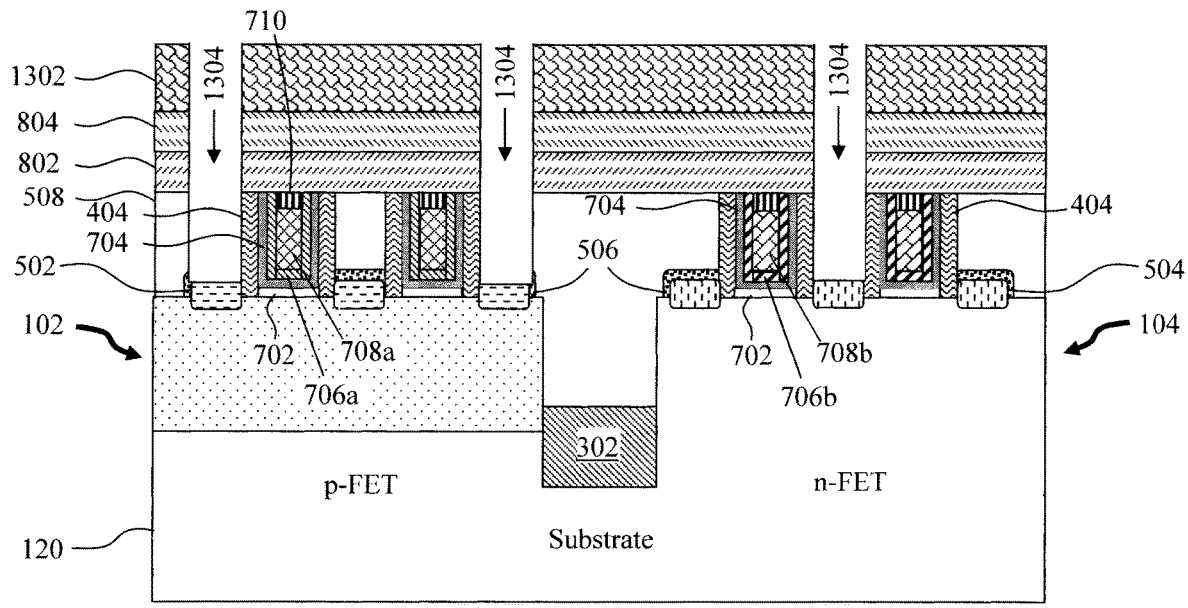
FIG. 13 is a cross-sectional diagram illustrating, according to an alternative embodiment which follows from FIG. 8, a (first) patterned OPL having been formed over the second oxide layer with the location of every other contact trench, and the first patterned OPL having been used to etch first contact trenches through the first and second oxide layers and the dielectric, down to the source and drains according to an embodiment of the present invention.

In this alternative embodiment, the steps remain the same as those described in conjunction with the description of FIGS. 1-8 above (up to the deposition of the second oxide layer 804. Namely, as shown in FIG. 13, an OPL 1302 is deposited on the second oxide layer 804, and standard lithography and etching techniques are used to pattern the OPL 1302 with the footprint and location of every other contact. Namely, by comparison with OPL 806 in FIG. 8 it can be seen that the OPL 1302 is opened over every other source and drain 502 and 504. Suitable OPL materials were provided above.

The patterned OPL 1302 is then used to etch (e.g., RIE) first contact trenches 1304 through the first/second oxide layers 802/804 and the dielectric 508, down to the source and drains 502 and 504. As provided above, the etch can be performed in multiple steps, i.e., first down to the etch stop layer 506, and then down the short remaining distance to the source and drains 502 and 504.

Figure 14:
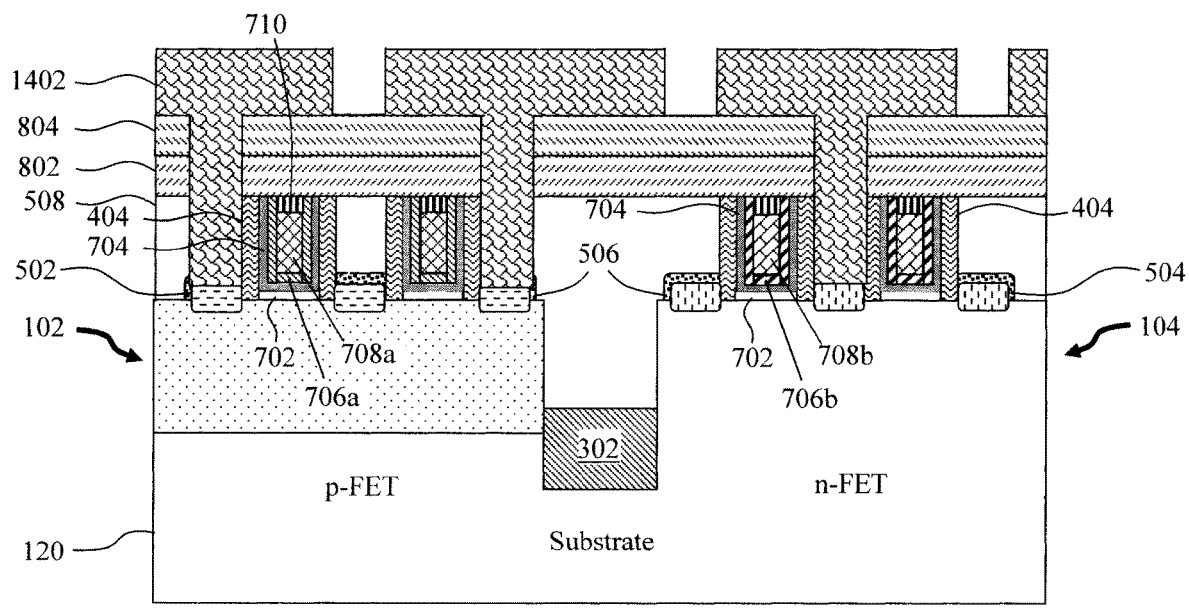
FIG. 14 is a cross-sectional diagram illustrating the first patterned OPL having been removed, a (second) OPL having been deposited on the second oxide layer, filling the first contact trenches, and the second OPL having been patterned with the location of the contacts skipped over in the first pass according to an embodiment of the present invention.
Figure 15:
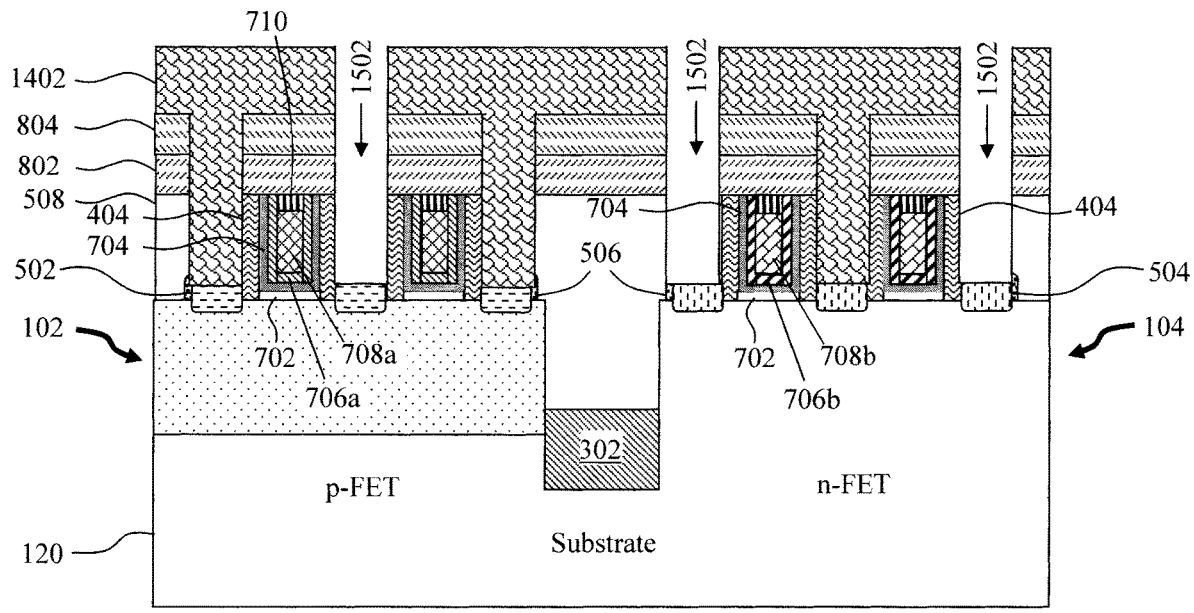
FIG. 15 is a cross-sectional diagram illustrating the second patterned OPL having been used to etch second contact trenches through the first and second oxide layers and the dielectric, down to the source and drains according to an embodiment of the present invention.
Figure 16:
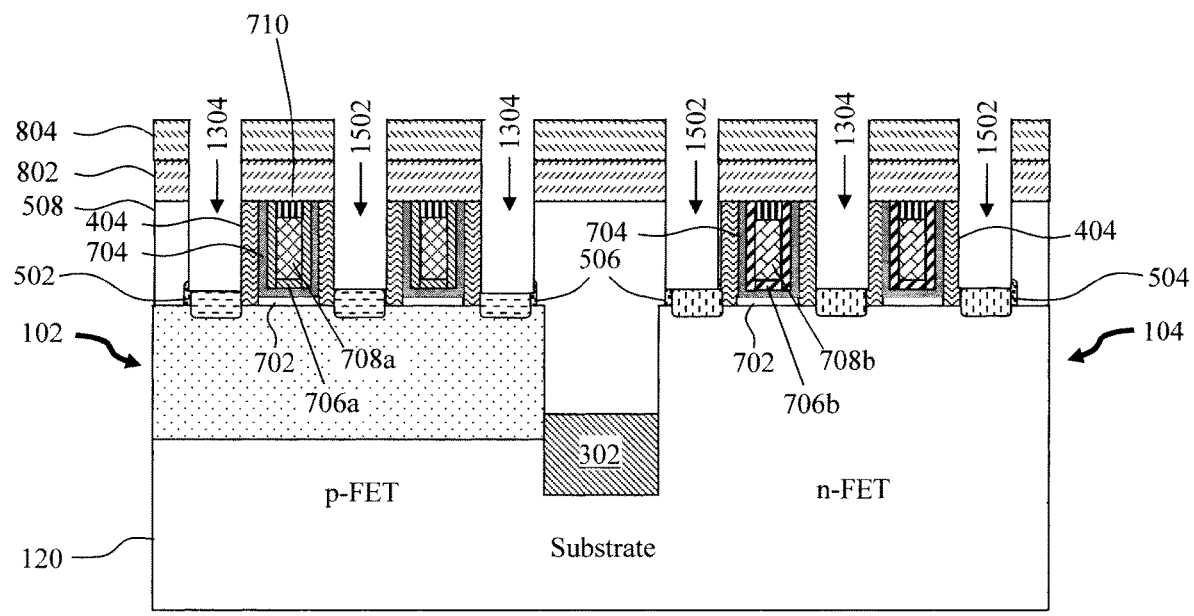
FIG. 16 is a cross-sectional diagram illustrating the second patterned OPL having been removed according to an embodiment of the present invention.
Figure 17:
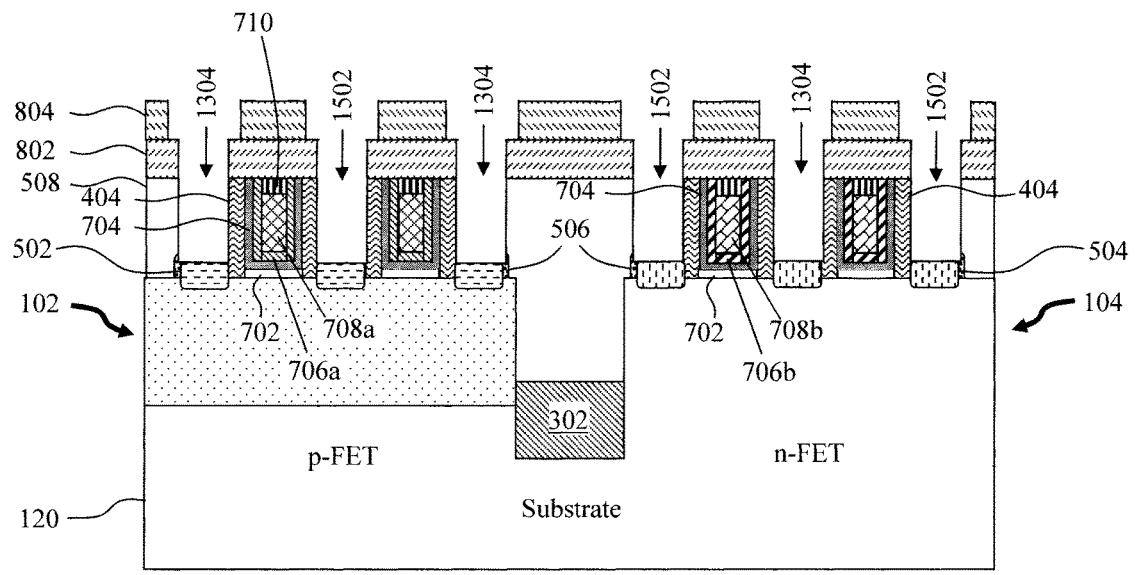
FIG. 17 is a cross-sectional diagram illustrating the top portion of the first and second contact trenches having been isotropically etched in the second oxide layer according to an embodiment of the present invention.

The patterned OPL 1302 is then removed, and the process is repeated to pattern the contact trenches skipped over in the first pass. For instance, as shown in FIG. 14, an OPL 1402 is deposited on the second oxide layer 804, filling the first contact trenches 1304. Suitable OPL materials were provided above. Standard lithography and etching techniques are then used to pattern the OPL 1402 with the footprint and location of the contacts skipped over in the first pass.

The patterned OPL 1402 is then used to etch (e.g., RIE) second contact trenches 1502 through the first/second oxide layers 802/804 and the dielectric 508, down to the source and drains 502 and 504. See FIG. 15. As provided above, the etch can be performed in multiple steps, i.e., first down to the etch stop layer 506, and then down the short remaining distance to the source and drains 502 and 504. The OPL 1402 is then removed. See FIG. 16.

Now that all of the contact trenches 1304/1502 have been patterned, in the same manner as described above, a non-directional/isotropic etching process is used to laterally expand the top portion of the contact trenches 1304/1502 in the second oxide layer 804. See FIG. 17. As described above, this lateral etching of the second oxide layer 804 (selective to the first oxide layer 802) is possible based on the differential etch rate between the two oxide layers. Namely, the HER oxide of the second oxide layer 804 etches at a greater rate than the LER oxide of the first oxide layer 802. As a result, the lateral expansion of the contact trenches 1304/1502 during the isotropic etching process occurs primarily in the second oxide layer 804. Suitable isotropic etching processes were provided above. The contact trenches 1304/1502 now have a shape that, when filled with a contact metal(s), will result in the present T-shaped tiered contact designs.

Figure 18:
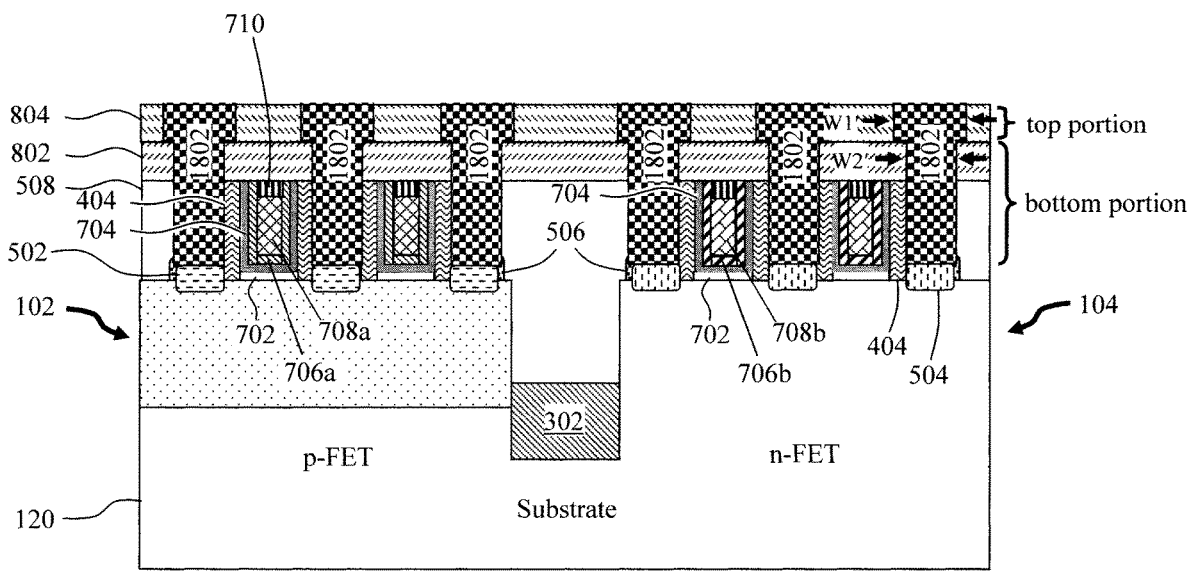
FIG. 18 is a cross-sectional diagram illustrating the first and second contact trenches having been filled with a contact metal(s) forming tiered-profile contacts according to an embodiment of the present invention.

Namely, as shown in FIG. 18, the contact trenches are next filled with a contact metal(s) forming T-shaped tiered contacts 1802. Suitable contact metals were provided above. When viewed in cross-section (as in FIG. 18), the T-shaped tiered contacts 1802 have a top portion with a width W1' that is greater than a width W2' of a bottom portion thereof, i.e., W1'>W2'.

The use of dual oxide layers with differential etch rates is only one technique contemplated herein for creating the present T-shaped tiered contacts. For instance, according to another exemplary embodiment, a (thicker) single oxide layer is employed. A partial etch of the contact trenches is performed to create the wider top portion of the trenches, after which sacrificial spacers are formed lining the inner sidewalls of the contact trenches reducing their footprint. The etch of the contact trenches is then completed between the sacrificial spacers to form the narrower bottom portions of the trenches. This exemplary alternative embodiment is now described by way of reference to FIGS. 19-25.

Figure 19:
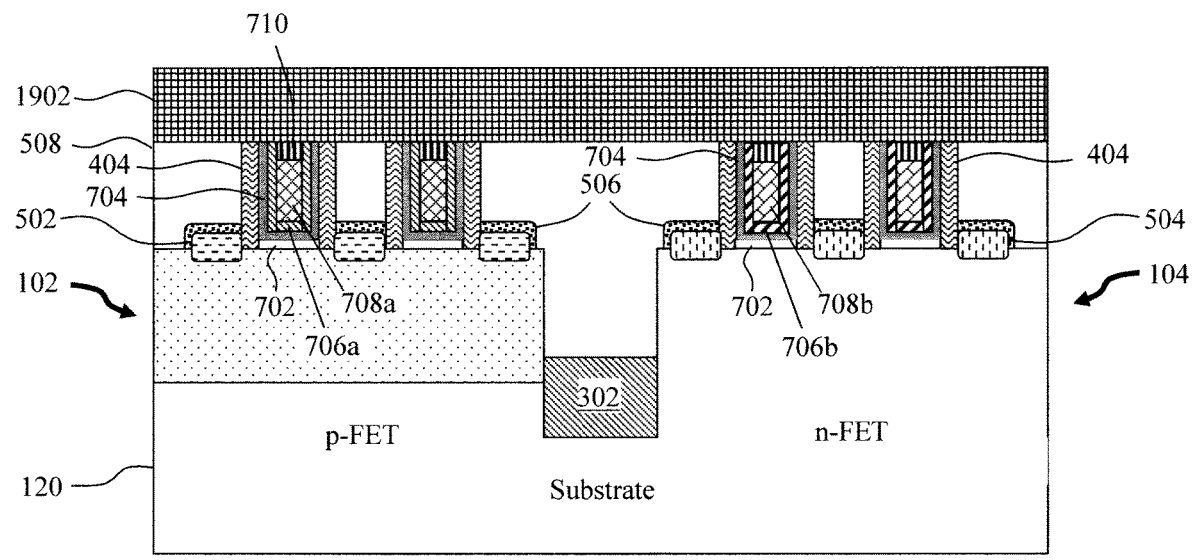
FIG. 19 is a cross-sectional diagram illustrating, according to an alternative embodiment which follows from FIG. 7, an oxide layer having been deposited onto the dielectric according to an embodiment of the present invention.

In this alternative embodiment, the steps are the same as those described in conjunction with the description of FIGS. 1-7 above. Following from FIG. 7, as shown in FIG. 19, an oxide layer 1902 is deposited onto the dielectric 508 over the p-FET and n-FET devices. According to an exemplary embodiment, the oxide layer 1902 is deposited to a thickness of from about 40 nm to about 60 nm, and ranges therebetween. Suitable materials for the oxide layer 1902 include, but are not limited to, $SiO_2$, spin on glass and/or $SiO_2$ doped with boron (B), carbon (C), nitrogen (N), fluorine (F) and/or any other etch rate control element(s).

An OPL 2002 is next deposited on the oxide layer 1902, and standard lithography and etching techniques are used to pattern the OPL 2002 with the footprint and location of the contacts. See FIG. 20. Suitable OPL materials were provided above.

Figure 20:
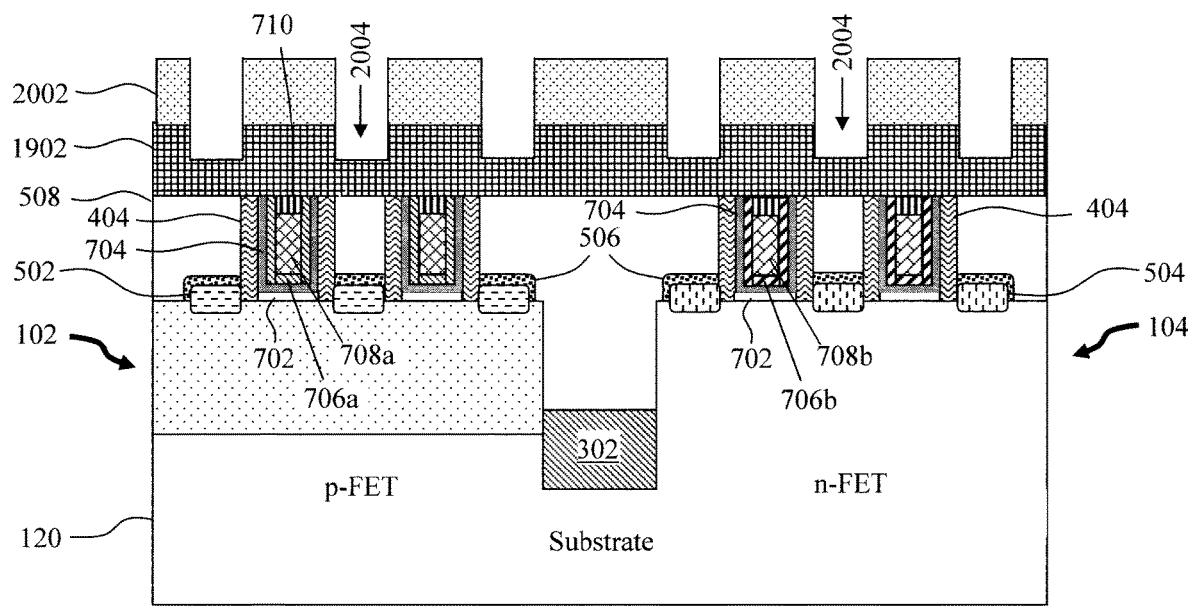
FIG. 20 is a cross-sectional diagram illustrating a patterned OPL having been formed on the oxide layer with the location of the contacts, and the patterned OPL having been used to pattern contact trenches partway through the oxide layer according to an embodiment of the present invention.

As shown in FIG. 20, the patterned OPL 2002 is then used to etch contact trenches 2004 partway through the oxide layer 1902. According to an exemplary embodiment, a directional/anisotropic etching process such as RIE is used. It is notable that the contact trenches 2004 formed in accordance with this alternative embodiment will have different widths within the (same) oxide layer 1902. This configuration results from terminating the first stage of the contact trench etch (as shown in FIG. 20) part way through the oxide layer 1902, and then using sacrificial spacers to reduce the footprint of the contact trenches 2004 before completing the etch.

Namely, a spacer material 2102 is next conformally deposited lining the (partial) contact trenches 2004. See FIG. 21. Suitable spacer materials 2102 include, but are not limited to, $SiO_2$ and/or silicon oxycarbonitride (SiOCN). A directional etch (e.g., RIE) is used to pattern the spacer material 2102 into individual spacers 2202 lining the inner sidewalls of the (partial) contact trenches 2004. See FIG. 22. Spacers 2202 are sacrificial structures since they will be removed after the etch of the contact trenches 2004 is completed.

The etch of the contact trenches is then completed between the spacers 2202 to extend the contact trenches the remaining way through the oxide layer 1902 and down to the source and drains 502 and 504. See FIG. 23. As provided above, the etch can be performed in multiple steps, i.e., first down to the etch stop layer 506, and then down the short remaining distance to the source and drains 502 and 504. With the spacers 2202 in place, the footprint of the contact trenches 2004 is reduced. Thus, the bottom portion of the contact trenches 2004 formed through the remaining thickness of the oxide layer 1902 and down to the source and drains 502 and 504 is narrower than the top. After removal of the patterned OPL 2002 and (sacrificial) spacers 2202, the contact trenches 2004 now have a shape that, when filled with a contact metal(s), will result in the present T-shaped tiered contact designs. See FIG. 24.

Namely, as shown in FIG. 25, the contact trenches are next filled with a contact metal(s) forming T-shaped tiered contacts 2502. Suitable contact metals were provided above. When viewed in cross-section (as in FIG. 25), the T-shaped tiered contacts 2502 have a top portion with a width W1" that is greater than a width W2" of a bottom portion thereof, i.e., W1">W2".

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming tiered-profile contacts to a semiconductor device, the method comprising the steps of:
   depositing, as a single layer, a first oxide layer over the semiconductor device;
   depositing, as another single layer, a second oxide layer on the first oxide layer to form dual oxide layers over the semiconductor device, wherein the second oxide layer has a greater etch rate than the first oxide layer;
   patterning contact trenches through the first oxide layer and the second oxide layer down to the semiconductor device, wherein a bottom portion of the contact trenches passes through the first oxide layer and a top portion of the contact trenches passes through the second oxide layer;
   isotropically etching the top portion of the contact trenches in the second oxide layer selective to the bottom portion of the contact trenches in the first oxide layer based on the second oxide layer having a greater etch rate than the first oxide layer to make the top portion of the contact trenches wider than the bottom portion; and
   filling the contact trenches with at least one contact metal to form the tiered-profile contacts to the semiconductor device, wherein portions of the tiered-profile contacts that pass through the dual oxide layers have a first width W1 only in the second oxide layer and a second width W2 only in the first oxide layer, and wherein W1>W2.

2. The method of claim 1, wherein the second oxide layer has a greater density than the first oxide layer.

3. The method of claim 1, wherein the first oxide layer comprises silicon dioxide ($SiO_2$) with an impurity selected from the group consisting of: hydrogen (H), nitrogen (N), germanium (Ge), silicon (Si), and combinations thereof.

4. The method of claim 1, wherein the second oxide layer comprises $SiO_2$ with an impurity selected from the group consisting of: boron (B), carbon (C), phosphorous (P), fluorine (F) and combinations thereof.

5. The method of claim 1, wherein the first oxide layer and the second oxide layer each have a thickness of from about 20 nm to about 30 nm, and ranges therebetween.

6. The method of claim 1, wherein the first oxide layer and the second oxide layer are each deposited using chemical vapor deposition (CVD) or atomic layer deposition (ALD).

7. The method of claim 1, further comprising the steps of:
   forming a patterned organic planarizing layer (OPL) on the second oxide layer;
   patterning the contact trenches using the patterned OPL; and
   removing the patterned OPL before isotropically etching the top portion of the contact trenches.

8. The method of claim 1, wherein the at least one contact metal is selected from the group consisting of: tungsten (W), copper (Cu), cobalt (Co), ruthenium (Ru), rhodium (Rh), nickel (Ni), platinum (Pt), palladium (Pd) and combinations thereof.

9. The method of claim 1, wherein the semiconductor device comprises at least one gate, and source and drains on opposite sides of the at least one gate, and wherein the tiered-profile contacts are formed to the source and drains.

10. A method for forming tiered-profile contacts to a semiconductor device, the method comprising the steps of: depositing, as a single layer, an oxide layer over the semiconductor device; patterning contact trenches partway through the oxide layer; forming sacrificial spacers along inner sidewalls of the contact trenches which reduces a footprint of the contact trenches; complete patterning of the contact trenches between the sacrificial spacers to extend the contact trenches down to the semiconductor device, wherein a top portion of the contact trenches extends partway through the oxide layer and a bottom portion of the contact trenches extends a remaining way through the oxide layer and down to the semiconductor device, the top portion of the contact trenches is wider than the bottom portion of the contact trenches; fully removing the sacrificial spacers after the patterning of the contact trenches has been completed; and filling the contact trenches with at least one contact metal to form the tiered-profile contacts to source and drains of the semiconductor device.

11. The method of claim 10, wherein the oxide layer has a thickness of from about 40 nm to about 60 nm, and ranges therebetween.

12. The method of claim 10, wherein the sacrificial spacers comprise a material selected from the group consisting of: $SiO_2$, silicon oxycarbonitride (SiOCN), and combinations thereof.

13. The method of claim 10, wherein the oxide layer comprises a material selected from the group consisting of: $SiO_2$, spin on glass, and combinations thereof.

14. The method of claim 10, wherein the at least one contact metal is selected from the group consisting of: W, Cu, Co, Ru, Rh, Ni, Pt, Pd, and combinations thereof.

15. The method of claim 10, wherein the semiconductor device comprises at least one gate, and wherein the source and drains are present on opposite sides of the at least one gate.

* * * * *